United States Patent
Zhang et al.

(10) Patent No.: US 10,608,069 B2
(45) Date of Patent: Mar. 31, 2020

(54) DISPLAYS WITH REDUNDANT BENT SIGNAL LINES AND NEUTRAL PLANE ADJUSTMENT LAYERS

(71) Applicant: Apple Inc., Cupertino, CA (US)

(72) Inventors: Zhen Zhang, San Jose, CA (US); Terry C. Lam, Mountain View, CA (US); Paul S. Drzaic, Morgan Hill, CA (US); Izhar Z. Ahmed, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 65 days.

(21) Appl. No.: 15/994,858

(22) Filed: May 31, 2018

(65) Prior Publication Data

US 2018/0374912 A1 Dec. 27, 2018

Related U.S. Application Data

(60) Provisional application No. 62/524,224, filed on Jun. 23, 2017.

(51) Int. Cl.
| | |
|---|---|
| *G06F 3/041* | (2006.01) |
| *H01L 27/32* | (2006.01) |
| *H01L 51/00* | (2006.01) |
| *H01L 51/52* | (2006.01) |
| *G06F 3/044* | (2006.01) |

(52) U.S. Cl.
CPC ........ *H01L 27/3276* (2013.01); *G06F 3/0412* (2013.01); *H01L 27/323* (2013.01); *H01L 51/0097* (2013.01); *H01L 51/5253* (2013.01); *G06F 3/044* (2013.01); *G06F 2203/04102* (2013.01); *G06F 2203/04107* (2013.01); *H01L 2251/5338* (2013.01)

(58) Field of Classification Search
CPC ............. H01L 27/3276; H01L 51/0097; H01L 27/323; H01L 2251/5338; H01L 51/5253; G06F 3/0412; G06F 3/044; G06F 2203/04107; G06F 2203/04102
See application file for complete search history.

(56) References Cited

U.S. PATENT DOCUMENTS

| | | | |
|---|---|---|---|
| 9,740,035 B2 | 8/2017 | Kwon et al. | |
| 2014/0232956 A1* | 8/2014 | Kwon | G02F 1/133305 349/12 |

(Continued)

*Primary Examiner* — Adam R. Giesy
(74) *Attorney, Agent, or Firm* — Treyz Law Group, P.C.; Kendall W. Abbasi

(57) ABSTRACT

A display may have an array of organic light-emitting diodes that form an active area on a flexible substrate. Display driver circuitry such as a display driver integrated circuit may be coupled to an inactive area of the flexible substrate. Metal traces may extend across a bent region of the flexible substrate between the active area and inactive area. Metal traces may have zigzag shapes to reduce stress when bending. Adjacent pairs of parallel segments in the metal traces may be shorted together by a bridging segment that extends perpendicular to the two parallel segments. The bridging segment may be offset from corners to avoid clusters of stress zones in the metal trace. Neutral plane adjustment layers in the bent region may include a metal layer to help counteract the bending force of the flexible substrate and the relaxation of an upper polymer coating.

21 Claims, 14 Drawing Sheets

(56) References Cited

U.S. PATENT DOCUMENTS

| | | | |
|---|---|---|---|
| 2015/0179728 A1* | 6/2015 | Kwon | H01L 27/3276 257/40 |
| 2016/0064130 A1* | 3/2016 | Eng | H01F 7/0252 335/229 |
| 2016/0105950 A1 | 4/2016 | Drzaic et al. | |
| 2016/0291723 A1* | 10/2016 | Kurasawa | G06F 3/044 |
| 2017/0110529 A1 | 4/2017 | Zhang et al. | |
| 2017/0256599 A1 | 9/2017 | Kim et al. | |
| 2018/0123060 A1 | 5/2018 | Jang et al. | |

\* cited by examiner

DISPLAYS WITH REDUNDANT BENT SIGNAL LINES AND NEUTRAL PLANE ADJUSTMENT LAYERS

This application claims the benefit of provisional patent application No. 62/524,224, filed Jun. 23, 2017, which is hereby incorporated by reference herein in its entirety.

BACKGROUND

This relates generally to electronic devices with displays, and, more particularly, to displays with bent portions.

Electronic devices often include displays. Displays such as organic light-emitting diode displays may be formed on flexible substrates. Displays with flexible substrates may be bent. For example, it may be desirable to bend an edge of a display to hide inactive display components along the edge of the display from view.

The process of bending a display can create stresses within the structures of the display. For example, bent metal traces may become stressed. Stress-induced damage such as cracks may adversely affect display reliability.

It would therefore be desirable to be able to provide improved displays with bent portions.

SUMMARY

A display may have an array of pixels. The pixels may contain light-emitting diodes such as organic light-emitting diodes and may form an active area that displays images.

The pixels may be formed from thin-film layers on a flexible substrate. Conductive traces such as metal traces may extend between the active area and an inactive area of the flexible substrate. Display driver circuitry such as a display driver integrated circuit may be coupled to contacts formed from the metal traces in the inactive area.

The metal traces may extend across a bent portion of the flexible substrate. To help enhance reliability for the metal traces, the metal traces may have meandering shapes such as zigzag shapes. Adjacent traces may be shorted together to provide redundancy. For example, each pair of adjacent traces may be shorted together by a series of redundant paths that bridge the gap between the adjacent traces.

The bridges between parallel segments may be perpendicular to the parallel segments to help separate neighboring stress zones. The bridges may be offset from corners of the zigzag segments to avoid clusters of stress zones near the corners of the metal trace.

The redundant segments in the signal paths may surround rectangular openings. The rectangular openings may have different sizes and may have different or alternating patterns from neighboring signal paths.

Neutral plane adjustment layers may include a metal layer to help counteract the bending force of the flexible substrate and the relaxation of an upper polymer coating. The metal layer may be connected to a ground power supply voltage to form an electromagnetic interference shield between pixel circuitry and touch sensor circuitry.

The metal layer in the bent region may be formed from the same material as one or more active display layers in the flat portion of the display. For example, the metal layer in the bent region may be formed from the same material as a signal layer, an anode layer, a cathode layer, a touch sensor layer, or other suitable active display layer.

Further features will be more apparent from the accompanying drawings and the following detailed description.

DETAILED DESCRIPTION

Figure 1:
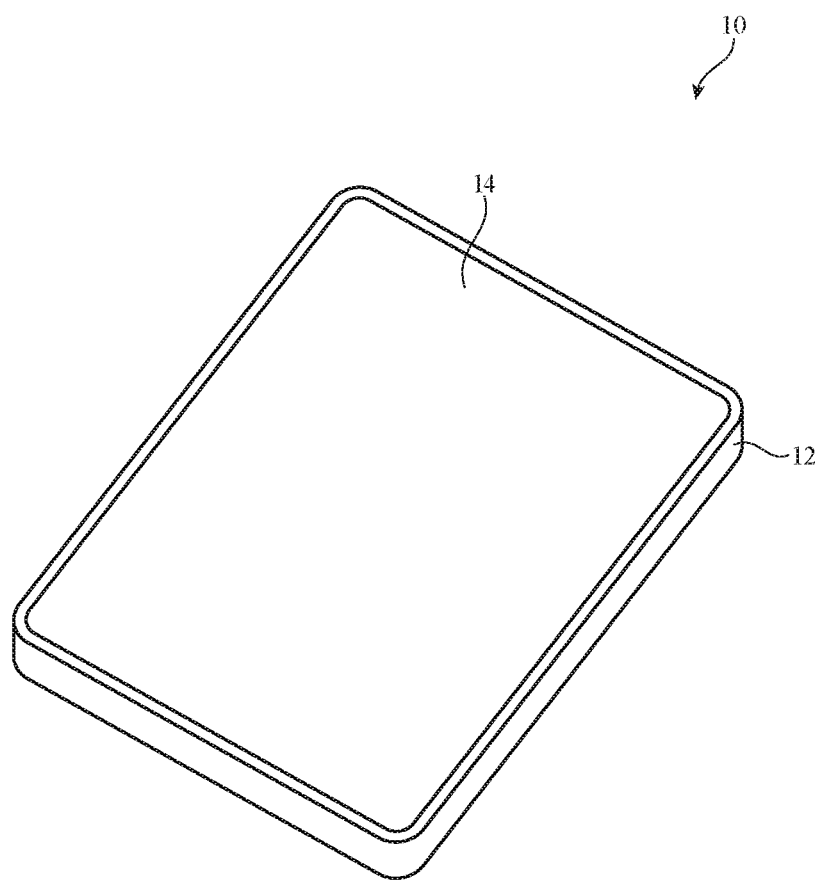
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, a watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. The array of pixels may display images for a user in active area of display 14. The active area may be surrounded on one or more sides by inactive border regions.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
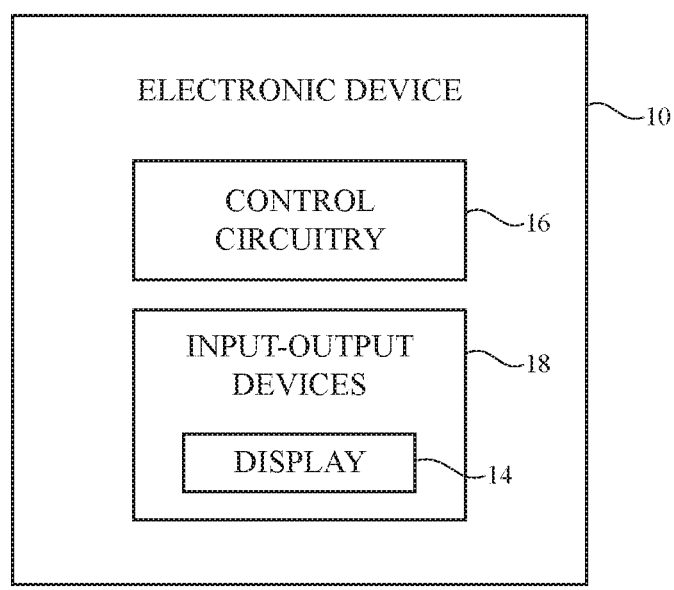
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint), may be circular or oval, may have a shape with both straight and curved edges, or may have other suitable shapes. Display 14 may be planar or may have a curved profile.

Figure 3:
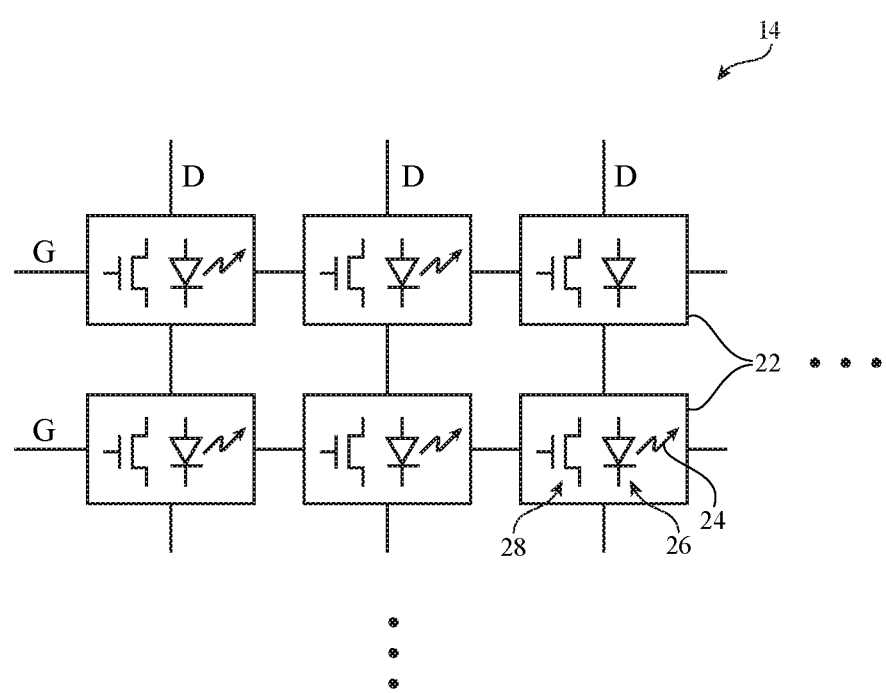
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors.

Figure 4:
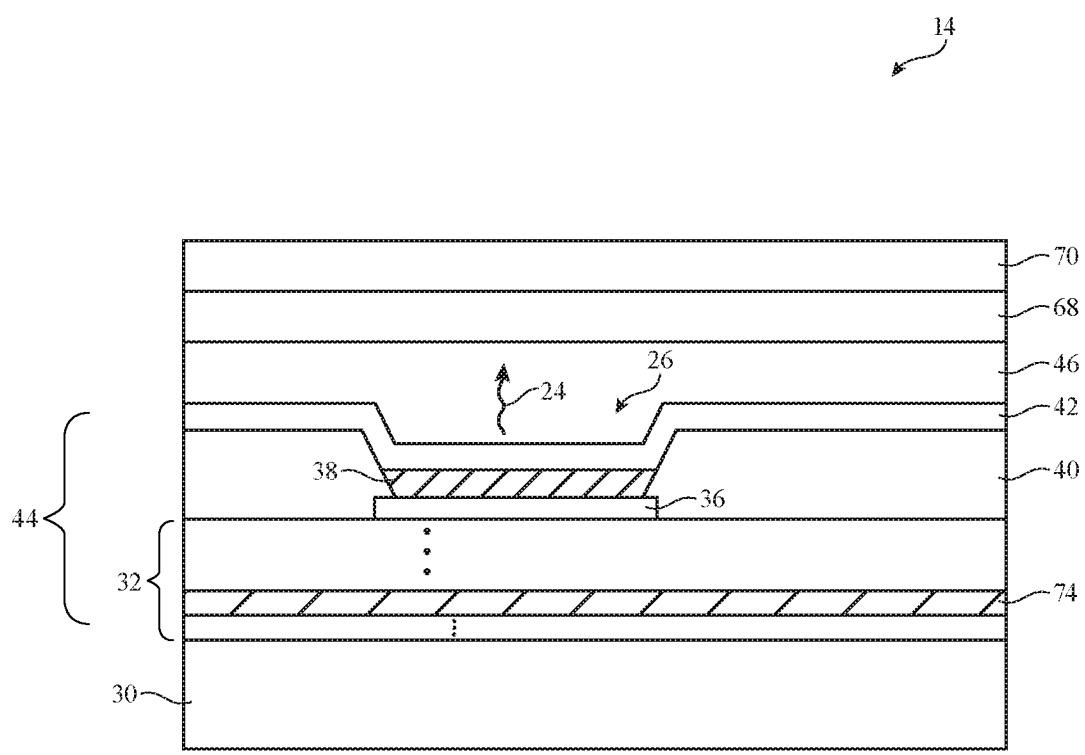
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from plastic or other suitable materials. One or more sublayers of material may form substrate 30. Configurations for display 14 in which substrate 30 has been formed from a flexible material such as polyimide, acrylic, or other flexible polymer are sometimes described herein as an example.

Thin-film transistor circuitry 44 may be formed on substrate 30. Thin film transistor circuitry 44 may include layers 32. Layers 32 may include inorganic layers such as inorganic buffer layers, gate insulator, passivation, interlayer dielectric, and other inorganic dielectric layers. Layers 32 may also include organic dielectric layers such as a polymer layers. Polymer layers may be used, for example, as planarization layers, as interlayer dielectric, and as neutral plane adjustment layers (as examples). Metal layers and semiconductor layers may also be included within layers 32. For example, semiconductors such as silicon, semiconducting-oxide semiconductors such as indium gallium zinc oxide, or other semiconductor materials may be used in forming semiconductor channel regions for thin-film transistors 28. Metal in layers 32 may be used in forming transistor gate terminals, transistor source-drain terminals, capacitor electrodes, and metal interconnects. If desired, conductive polymers, conductive nanostructures, and other conductive materials may be included in display 14 (e.g., to form signal traces in a bent portion of display 14).

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 40. Pixel definition layer 40 may be formed from a patterned photoimageable polymer such as polyimide. In each light-emitting diode, organic emissive material 38 is interposed between a respective anode 36 and cathode 42. Anodes 36 may be patterned from a layer of metal. Cathode 42 may be formed from a common conductive layer that is deposited on top of pixel definition layer 40 (e.g., a thin layer of metal such as a layer of AgMg). Cathode 42 is transparent so that light 24 may exit light emitting diode 26. During operation, light-emitting diode 26 may emit light 24.

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74. Portions of metal traces 74 and other conductive traces may extend from pixels 22 to inactive areas of display 14.

If desired, display 14 may have a protective outer display layer such as cover glass layer 70. The outer display layer may be formed from a material such as sapphire, glass, plastic, clear ceramic, or other transparent material. Protective layer 46 may cover cathode 42. Layer 46 may include adhesive, moisture barrier structures and other encapsulation structures, and/or other materials to help protect thin-film transistor circuitry 44. Functional layers 68 may be interposed between layer 46 and cover layer 70. Functional layers 68 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as layer 46, thin-film transistor circuitry 44, and substrate 30. If desired, touch sensor structures for display 14 may be formed from metal layers in thin-film transistor circuitry 44 rather than using a separate touch sensor panel in layer 68.

Display 14 may have an active area in which pixels 22 form images for viewing by a user of device 10. The active area may have a rectangular shape or other suitable shape. Inactive portions of display 14 may surround the active area. For example, signal traces and other support circuitry such as thin-film display driver circuitry may be formed along one or more of the four edges that run around the rectangular periphery of a rectangular display or may be formed along other peripheral portions of display 14 adjacent to the active area. If desired, one or more display driver integrated circuits may be mounted to substrate 30 in the inactive border (e.g., integrated circuit pads on one or more display driver integrated circuits may be coupled to corresponding contact pads formed at the ends of the signal paths on substrate 30 in the inactive border). This allows the display driver circuitry to supply signals to the data and gate lines on display 14. If desired, a flexible printed circuit on which one or more display driver integrated circuits have been mounted using solder may be attached to contact pads formed from the end portions of the signal lines in the border of display 14.

To minimize the amount of the inactive border area of display 14 that is visible to a user, one or more edges of display 14 may be bent. As an example, the edge of display 14 to which a display driver circuit or flexible printed circuit has been attached may be folded under the active area of display 14. This helps minimize visible display borders and reduces the footprint of display 14.

Figure 5:
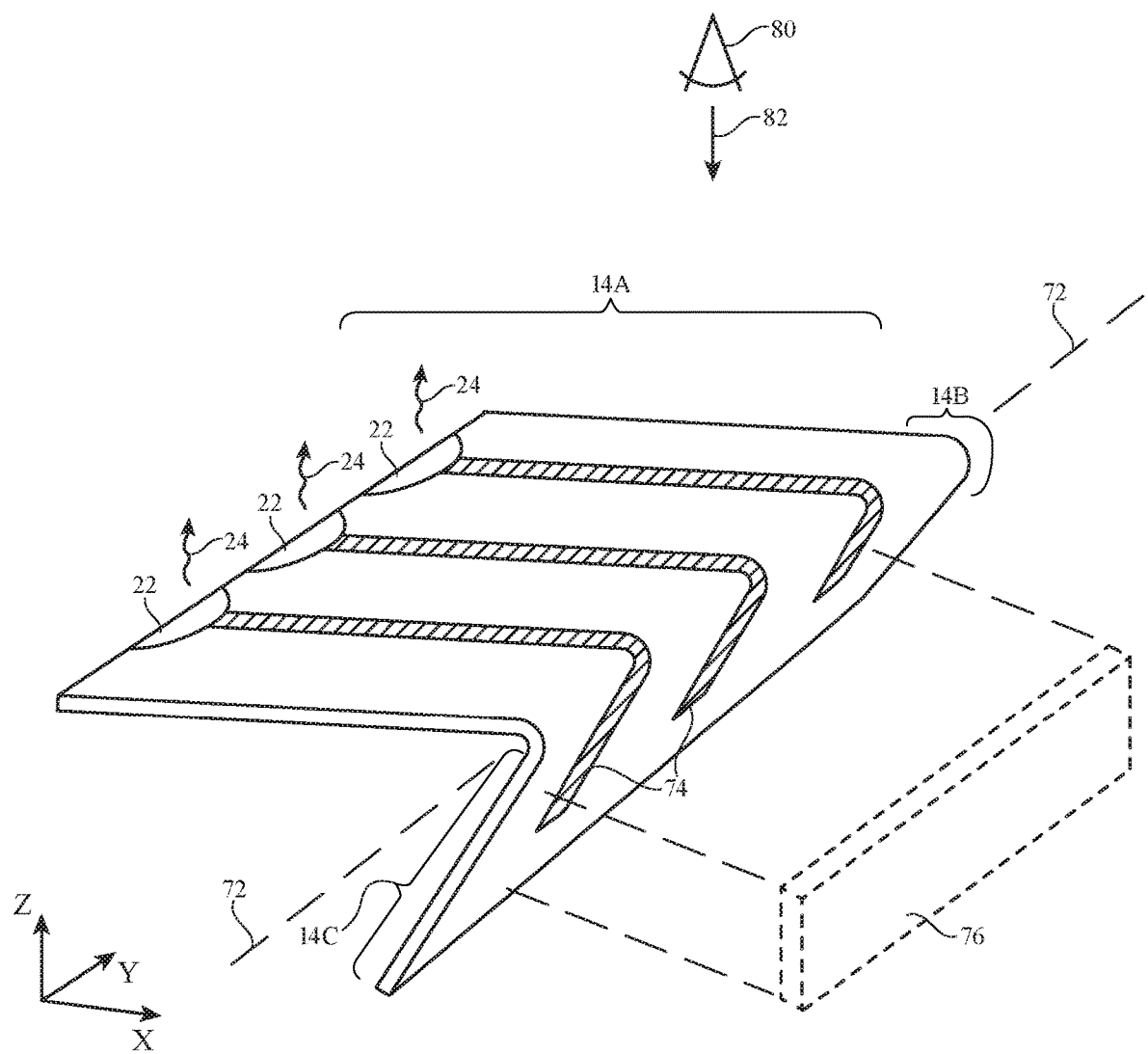
FIG. 5 is perspective view of an illustrative display with a bent portion in accordance with an embodiment.

An illustrative display with a bent edge portion is shown in FIG. 5. As shown in FIG. 5, display 14 has portion 14A (i.e., a planar active area portion that contains the active area of display 14 that is formed by an array of pixels 22), bent portion 14B, and inactive portion 14C. If desired, connectors, display driver integrated circuits or other integrated circuits, flexible printed circuits, and/or other components 76 may be mounted to inactive portion 14C of display 14.

Conductive traces such as metal traces 74 may carry signals between inactive area 14C of display 14 and active area 14A of display 14 (i.e., metal traces 74 may traverse bent portion 14B of display 14). When bent portion 14B is bent around bend axis 72, portion 14C may be folded partly or completely under portion 14A and may therefore be hidden from view by a user such as viewer 80 who is viewing display 14 in direction 82. As shown in FIG. 5, component(s) 76 (e.g., display driver circuitry, etc.) may be mounted on the upper and/or lower surface of display 14 in region 14C. An optional support structure such as a mandrel with a curved surface may be used to support display 14 in bend region 14B (e.g., to help establish a desired minimum bend radius in region 14B) or the mandrel may be omitted to help minimize display thickness (e.g., by allowing portions 14A and 14C to be mounted more closely together and by allowing the bend radius for region 14B to be reduced).

When bending display 14 in region 14B, care should be taken to ensure that sensitive display structures do not become damaged. Stresses can be imparted to display structures in a flexible display when the display is bent. For example, conductive traces such as metal traces 74 of FIG. 5 that are used to form signal lines that convey signals between display driver circuitry or other circuits in inactive region 14C and pixels 22 in region 14A may be subjected to bending stresses in bend region 14B.

To help prevent damage to the signal lines in bend region 14B, the signal paths of display 14 may be provided with redundancy. For example, pairs of adjacent lines may be shorted together using periodic redundancy connections. Meandering path shapes such as zigzag shapes and serpentine shapes may also be used for the portions of the signal lines traversing region 14B. Particularly in high-resolution displays, there may be a relatively large number of signal lines passing through region 14B (e.g., hundreds or thousands or more).

Figure 6:
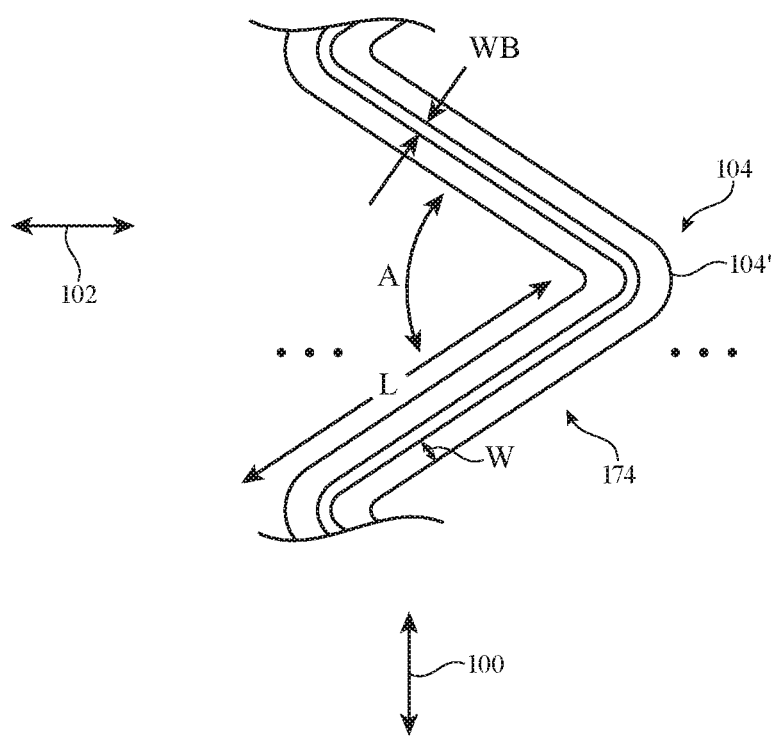
FIG. 6 is a top view of a portion of a display showing how zigzag signal lines may be used to help accommodate display bending in accordance with an embodiment.

A top view of illustrative meandering signal lines of the type that may be used for bent portion 14B of display 14 is shown in FIG. 6. There may be any suitable number of lines 174 (e.g., tens, hundreds, or thousands of lines). Signal lines 174 may be formed from metal traces 74 in layers 32 and/or other conductive traces. Lines (traces) 174 may extend in a direction parallel to axis 100 (i.e., axis 100 may be parallel to the longitudinal axes of lines 174). Bend axis 72 (FIG. 5) may extend perpendicular to lines 174 (i.e., bend axis 72 may run parallel to axis 102).

Lines 174 may have a width W of about 2.5 microns (e.g., more than 1 micron, more than 2 microns, 2-10 microns, less than 10 microns, less than 5 microns, 5-30 microns, 10-75 microns, less than 50 microns, or other suitable width). The separation WB between adjacent lines 174 may be more than 1 micron, more than 2 microns, 2-10 microns, less than 10 microns, less than 5 microns, 5-30 microns, 10-75 microns, less than 50 microns, or other suitable distance. The length L of each segment of line 174 between successive line bends 104 may be about 50-250 microns, more than 40 microns, less than 300 microns, 10-100 microns, less than 25 microns, more than 20 microns, or other suitable length. The thickness of each line may be less than 1 micron, less than 0.5 microns, 0.1 to 0.3 microns, more than 0.01 micron, more than 0.1 microns, 0.05 to 0.5 microns, or other suitable thickness. Corners 104 of lines 174 may be curved to help reduce stress concentration. Curved corners may be produced using curved photolithographic masks and/or using semiconductor fabrication techniques (e.g., wet or dry etching techniques or other patterning techniques) that help create curved edges at bends in lines 174. As an example, corner edges 104' of lines 174 may have a bending radius of 0.2 mm, 0.1 to 0.3 mm, more than 0.05 mm, less than 0.5 mm, or other suitable bend radius. The separation angle A between successive segments of lines 174 between the bends at corners 104 may be about 120° (i.e., the tilt angle of each segment of line 174 with respect to axis 100 may be about) 60°. Axis 100 runs parallel to the longitudinal axis of zigzagging line 174 (vertically in the orientation of FIG. 6) and crosses bend axis 72 at a right angle. If desired, the value of A may be less than 120° (e.g., 0-120°) or may be more than 120° (e.g., 120° to 180°). The use of a value for A of 120° is merely illustrative.

Signal paths in region 14B may be provided with redundancy by shorting together adjacent lines. Two thin lines that are shorted together may exhibit better immunity to stress-induced damage than one thicker line with a width equal to the widths of the two thin lines added together. As a result, arrangements in which two or more parallel signal lines are shorted together may help ensure that the signal paths in region 14B operate satisfactorily, even when display 14 is bent tightly in region 14B.

Figure 7:
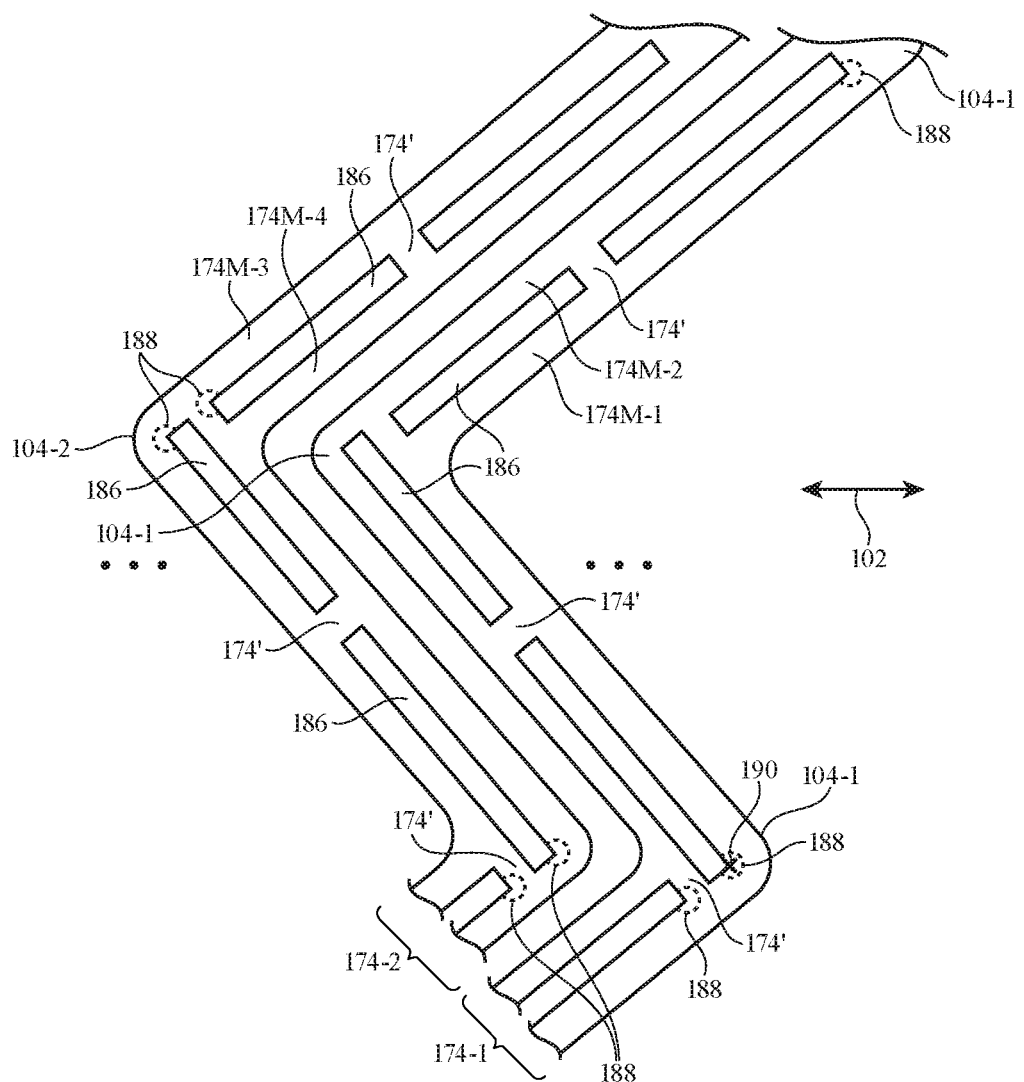
FIGS. 7, 8, 9, and 10 are top views of illustrative zigzag signal paths with redundancy and separated stress zones in accordance with an embodiment.

An illustrative configuration for display 14 with zigzag traces in region 14B that include redundancy structures is shown in FIG. 7. In the example of FIG. 7, signal path 174-1 is formed from parallel adjacent metal lines 174M-1 and 174M-2, which are shorted together with redundancy paths 174' and signal path 174-2 is formed from parallel adjacent metal lines 174M-3 and 174M-4, which are shorted together with redundancy paths 174'. Redundancy paths (segments) 174' bridge the gaps separating the adjacent lines. Each of paths 174-1 and 174-2 contains a pair of adjacent lines. If desired, three or more adjacent lines may be shorted together to provide additional redundancy.

In the example of FIG. 7, redundancy paths 174' are located in the middle of the zigzagging segments of each line and near the corners of each line. If desired, redundancy paths 174' may be formed at other locations along the lengths of lines 174, may only be located at corners 104, or may have any other suitable location.

As shown in FIG. 7, there is a potential for stress zones such stress zones 188 to develop in bent metal traces. Cracks may form in stress zones 188. As an example, crack 190 may originate at a sharp bend in the metal traces (e.g., corners 104-1 and 104-2 of signal paths 174-1 and 174-2, respectively), which may exhibit more internal stress than other portions of lines 174. However, crack 190 tends to stop propagating once it reaches the edges of stress zone 188 because the metal outside of stress zones 188 exhibits low stress. The low stress level in the regions between stress zones 188 can help terminate further propagation of crack 190.

Care must be taken to ensure that stress zones 188 are not so close to one another that they form one combined larger stress zone. For example, if the two stress zones 188 near corner 104-2 of FIG. 7 were closer together, the two stress zones 188 could merge, creating one large stress zone that would allow cracks to potentially propagate longer distances across the metal line. The location and orientation of redundancy paths 174' may be such that stress zones 188 do not cluster together near corners 104 and instead remain separate. For example, paths 174' in signal path 174-1 may extend perpendicularly between metal trace 174M-1 and metal trace 174M-2, and paths 174' in signal path 174-2 may extend perpendicularly between metal trace 174M-3 and 174M-4. The perpendicular bridges 174' between traces 174M-1 and metal trace 174M-2 and between 174M-3 and 174M-4 creates rectangular slits or openings 186. Rectangular slits 186 may have curved corners or angled corners with 90 degree angles.

As signal lines 174 are bent around bend axis 72 (parallel to axis 102 of FIG. 7), stress zones 188 may be created near some of the corners of slits 186. The shape and location of rectangular slits 186 may help ensure that stress zones 188 are separated by low stress zones are not clustered near corners 104. For example, as shown in FIG. 7, by offsetting bridging segments 174 from corners 104, one rectangular slit 186 extends closer to corner 104 than an adjacent rectangular slit 186. This may result in one stress zone 188 near corner 104 and another stress zone that is slightly offset from corner 104. These stress zones 188 are separated by a low stress zone so that cracks in one stress zone 188 do not propagate beyond that stress zone.

Figure 8:
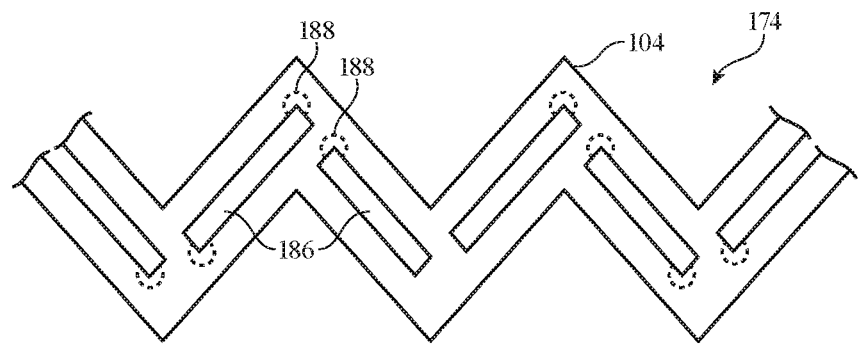
Figure 9:
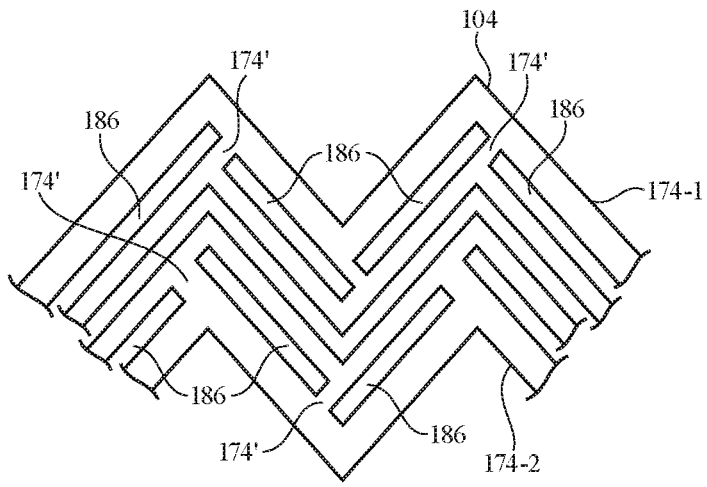
Figure 10:
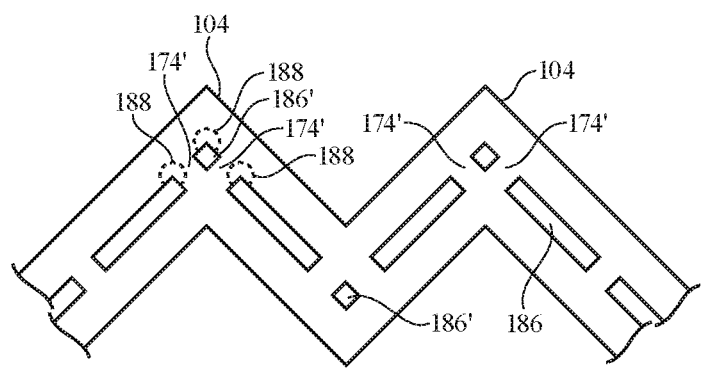

FIGS. 8, 9, and 10 show illustrative zigzag signal paths with redundancy structures and different patterns of slits. In the example of FIG. 8, each slit 186 has one end that extends close to a corner 104 and an opposing end that stops short of the adjacent corner 104. In the example of FIG. 9, adjacent signal paths 174-1 and 174-2 have slits 186 with alternating locations (e.g., the pattern of slits 186 in signal path 174-1 is different from the pattern of slits 186 in signal path 174-2). In the example of FIG. 10, two redundancy paths 174' are formed on either side of each corner 104, forming a smaller opening 186' between the two redundancy paths 174'. The additional redundancy path 174' may increase the signal path's immunity to stress-induced damage, while maintaining separation between stress zones 188.

It may also be desirable to minimize bending stress and thereby minimize cracks in signal paths 174 and other traces 74 using neutral plane adjustment layers. Neutral plane adjustment layers may be used to align the neutral plane of display 14 in bend region 14B with traces 74 (e.g., traces 74 that form signal paths 174).

Figure 11:
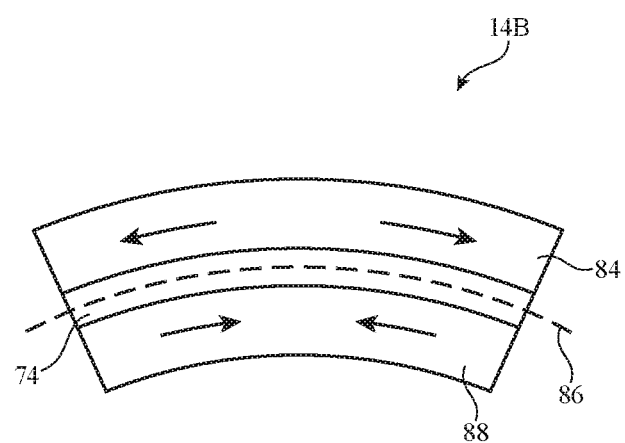
FIG. 11 is a cross-sectional side view of an illustrative bent substrate showing how a neutral plane may be aligned with a layer of signal lines using one or more neutral plane adjustment layers in accordance with an embodiment.

As shown in FIG. 11, when a portion of display 14 is bent in region 14B, some layers such as layer(s) 88 (e.g., a portion of display 14 that includes substrate 30) may be subjected to compressive stress and some layers such as layer(s) 84 (e.g., a coating layer and other layers above the substrate) may be subjected to tensile stress. Neutral plane 86 arises where stress has been eliminated by balancing the compressive stress and tensile stress. The shape of neutral plane 86 may be curved in a curved portion of display 14 such as portion 14B of FIG. 5 (i.e., neutral plane 86 may have a curved profile).

The relative thicknesses of layers 88 and 84 and the relative modulus of elasticity values for layers 88 and 84 determine the location of the neutral plane within the layers of bent display region 14B. For example, if the elasticity of layer 88 and layer 84 is the same, neutral plane 86 can be aligned with metal traces 74 between layers 88 and 84 by ensuring that layer 84 has the same thickness as layer 88. If, on the other hand, layer 84 has an elasticity that is larger than that of layer 88, layer 84 need not be as thick as layer 88 to balance the compressive and tensile stresses in this way.

Figure 12A:
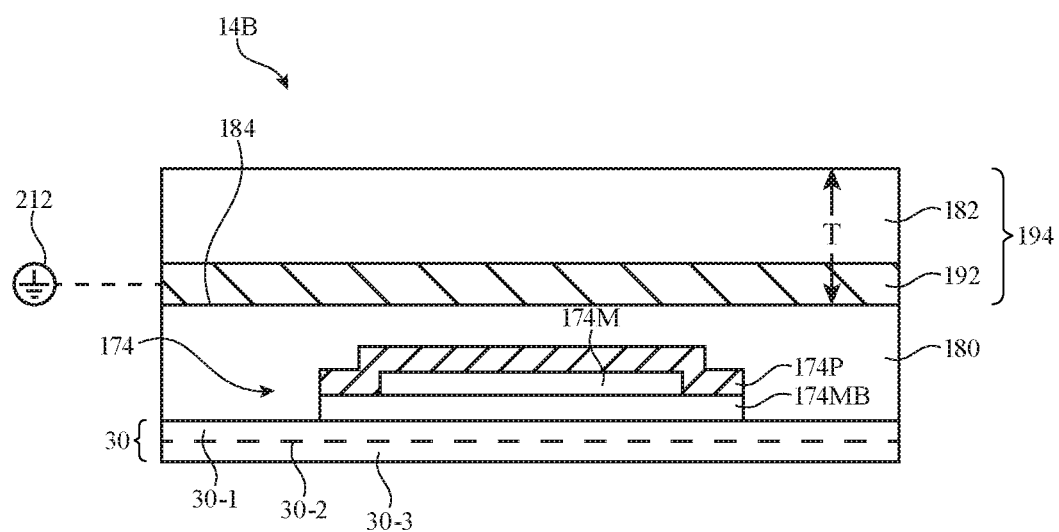
FIG. 12A is a cross-sectional side view of a portion of a display showing how a metal layer may be used to adjust a neutral plane to align with a signal line in accordance with an embodiment.

FIG. 12A is a cross-sectional side view of a portion of display 14 containing an illustrative signal line (e.g., a signal line such as line 174 of FIG. 6, 7, 8, 9, or 10). As shown in FIG. 12A, bend region (bent region) 14B of display 14 may include substrate 30. Substrate 30 may include one or more layers of material and may be flexible. With one illustrative configuration, substrate 30 may include upper and lower layers 30-1 and 30-3 formed from a flexible polymer such as polyimide and an interposed barrier layer 30-2. Barrier layer 30-2 may be formed from one or more layers of inorganic material such as silicon oxide and may help block moisture. The thickness of substrate 30 may be 3-20 microns, less than 20 microns, less than 8 microns, less than 7 microns, less than 6 microns, or other suitable thickness.

If desired, line 174 may be formed using a strip of buffer layer material such as buffer layer 174MB. Layer 174MB, which may sometimes be referred to as a multilayer buffer, may be interposed between substrate 30 and conductive layer 174M. Layer (trace) 174M may be formed from metal or other conductive material. Layer 174MB may help prevent moisture from reaching metal layer 174M. Layer 174MB may include one or more layers of material such as alternating layers of inorganic material (e.g., silicon oxide alternated with silicon nitride), other inorganic layer(s) and/or organic layer(s).

Layer 174 may be formed form a metal such as aluminum, molybdenum, titanium, copper, silver, gold, other metals, metal alloys, and/or multiple sublayers formed from these metals or other suitable metals. Layer 174 may also be formed from conductive polymers such as poly(3,4-ethylenedioxythiophene) polystyrene sulfonate, conductive nanostructures (e.g., silver nanowires, carbon nanotubes, etc.), and other conductive materials (e.g., carbon inks, etc.). Configurations in which conductive traces for display 14 are formed from metal may sometimes be described herein as an example. This is, however, merely illustrative. Any suitable conductive material may be used in forming the signal lines that traverse bend region 14B of display 14.

Dielectric passivation layer 174P may be formed on top of layer 174M. Portions of passivation layer 174P may extend down the sides of layer 174M and may contact buffer layer 174MB. In this way, the metal line formed from layer 174M may be surrounded by dielectric material that helps prevent moisture from reaching the metal line, thereby helping to avoid corrosion. Passivation layer 174P may be formed from one or more inorganic layers (e.g., silicon oxide, silicon nitride, silicon oxynitride, etc.) and/or one or more polymer layers.

Inorganic layers such as buffer layer 174MB and passivation layer 174P may be patterned to match the trace geometry of trace 174 shown in FIGS. 5, 6, 7, 8, 9, and 10. Inorganic layers 174MB and 174P may match the footprint of metal layer 174M or may extend beyond the edges of metal layer 174M (as shown in the example of FIG. 12A). Inorganic layers 174MB and 174P may be patterned to surround metal layer 174M and/or other metal layers on substrate 30.

Polymer planarization layer 180 may cover line 174 and may have a planar upper surface (surface 184). If desired, one or more additional layers of signal lines such as lines 174 may be formed above the first layer of lines that is shown in FIG. 12A.

Layers 194 may cover layer 180 and any layers formed above layer 180. Layers 194, which may sometimes be referred to as neutral plane adjustment layers, may have an overall thickness T and bending stiffness that place neutral plane 86 (FIG. 11) in a desired location. Layers 194 may, for example, be configured to align neutral plane 86 with signal lines 174 in region 14B to help reduce stress in region 14B and reduce cracks in signal lines 174.

Neutral plane adjustment layers 194 may include a coating layer such as layer 182 and one or more additional layers such as layer 192. Coating layer 182 may be formed from an organic material such as polyimide or other polymer. In some configurations, coating layer 182 may be formed from a polymer coating that is more compliant than substrate 30. If coating layer 182 were the only layer being used to counteract the bending force of substrate 30, coating layer 182 would need to be thicker than substrate 30. Care must be taken, however, to ensure that coating 182 is not too thick. If polymer coating 182 is too thick, it will become too difficult to bend in region 14B. Polymer coating 182 may also relax during and after bending, which can cause the neutral plane to shift downwards. Care must therefore be taken to ensure that the relaxation of polymer coating 182 does not cause neutral plane 86 to shift below traces 174, which would then place traces 174 under tensile stress.

To help counteract the bending force of substrate 30 and avoid a large downward shift of the neutral plane, neutral plane adjustment layers 194 may include layers other than polymer coating 182. For example, neutral plane adjustment layers 194 may include one or more additional layers such as layer 192. If desired, layer 192 may be a metal layer. Because metal is generally stiffer than polymer, the use of metal layer 192 in neutral plane adjustment layers 194 may help counteract the bending force of lower substrate 30. The assistance from metal layer 192 may be such that polymer layer 182 need not be as thick to balance the bending force of lower substrate 30. For example, the thickness of polymer layer 182 may be about 50 microns or other suitable thickness (e.g., between 30 and 60 microns, between 50 and 100 microns, greater than 100 microns, or less than 100 microns). In addition to allowing for a thinner polymer layer 182, metal layer 192 may also help to avoid a large downward shift in the neutral plane as layer 182 relaxes. A thinner polymer layer 182 will cause less of a shift in neutral plane as it relaxes (since it is already more flexible to begin with at the reduced thickness), and the stiffness of metal layer 192 will help keep the neutral plane from shifting below traces 174. The combination of metal layer 192 and polymer layer 182 may ensure that the neutral plane remains aligned with signal lines 74.

Layer 192 may be a metal layer that is formed during an existing display processing step by extending a metal layer in active area 14A of display 14 to bent region 14B of display 14. For example, metal layer 192 may be formed by extending one or more of the materials that are used to form thin-film transistors 44 (FIG. 4) in active area 14A to bent region 14B (e.g., layer 192 may be formed from the same material and during the same processing step as signal lines 74, anode 36, cathode 42, touch sensor structures such as a layer of indium tin oxide, other suitable display layers that are extended to bent region 14B, or a combination of these layers). Although metal layers in stack 194 may be formed from the same material as active display layers (if desired), these metal layers need not carry signals or be actively driven at any voltage in region 14B. The metal layers need not extend continuously between the active display layers in region 14A and neutral plane adjustment layers 194 in region 14B. If desired, there may be gaps in the metal layers between region 14A and region 14B.

If desired, layer 192 may be used as a shielding layer to shield one or more display layers from electromagnetic interference. For example, layer 192 may be located between thin-film transistor circuitry 44 and touch sensor circuitry in layer 68 of FIG. 5 and may be used to block electromagnetic interference between the display circuitry below layer 192 and the touch sensor circuitry above layer 192. Layer 192 may be grounded (e.g., coupled to a power supply source such as power supply source 212) or may be floated (e.g., not actively driven at any power supply voltage).

In the example of FIG. 12A, the vertical (side) edges of trace 174 are perpendicular to the upper surface of substrate 30. If desired, the side edges of trace 174 may be non-perpendicular to the upper surface of substrate 30 to suppress interfacial crack initiation along the interface of layers 174MB, 174P, 174M and planarization layer 180. An example of this type of arrangement is shown in FIG. 12B.

Figure 12B:
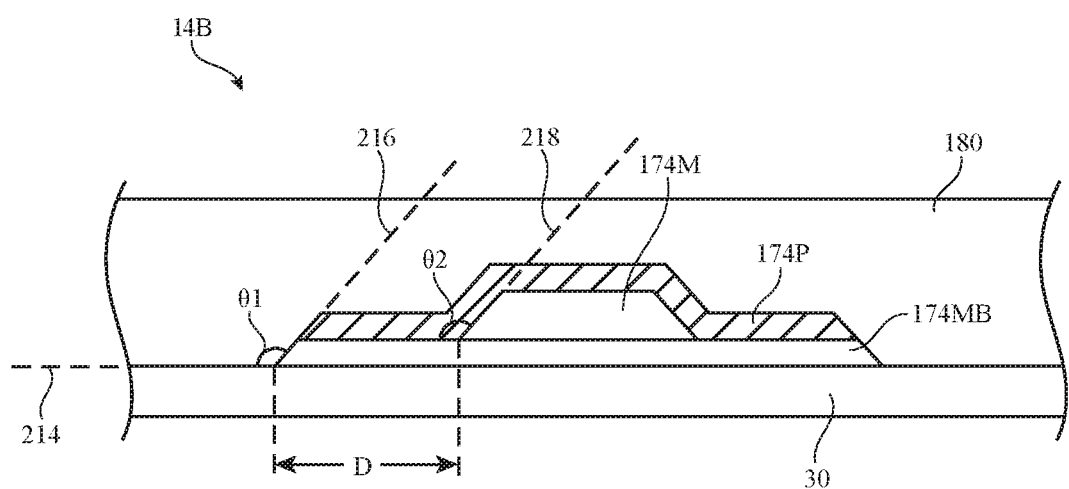
FIG. 12B is a cross-sectional side view of a portion of a display showing how a signal line may have angled sides to help prevent crack formation in accordance with an embodiment.

As shown in FIG. 12B, the side edges of layers 174MB, 174P, and 174M may be angled relative to the upper surface of substrate 30. The angle θ1 between the upper surface of substrate 30 (indicated by line 214) and the side edge of layers 174B and 174P (indicated by line 216) may be between 90° and 160°, between 90° and 180°, between 100° and 120°, between 120° and 150°, greater than 90°, etc. The angle θ2 between the upper surface of substrate 30 (indicated by line 214) and the side edge of metal layer 174M (indicated by line 218) may be between 90° and 160°, between 90° and 180°, between 100° and 120°, between 120° and 150°, greater than 90°, etc. The taper angle between vertical edges of 174MB/174P/174M and substrate 30 could vary, say from 90 degree to 160 degree. Angle θ2 may be the same as angle θ1 or may be different from angle θ1. The angled side edges of these layers may help suppress interfacial crack initiation at the interface of layers 174MB, 174P, 174M, and planarization layer 180. If desired, the distance D by which layers 174MB and 174P extend beyond metal layer 174M may be adjusted to achieve the appropriate level of protection for metal layer 174M.

Figure 13:
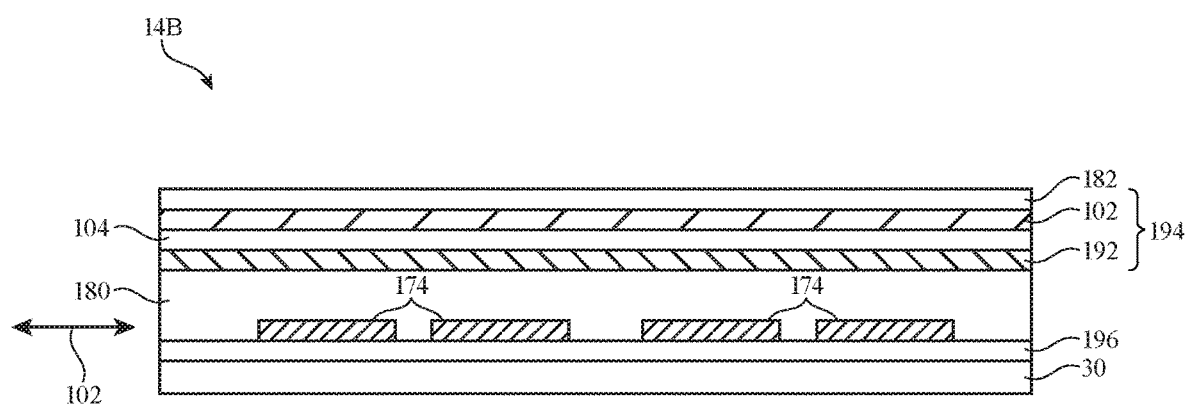
FIG. 13 is a cross-sectional side view of a portion of a display showing how more than one metal layer may be used to adjust a neutral plane to align with a signal line in accordance with an embodiment.

FIG. 13 shows how neutral plane adjustment layers 194 may include two or more metal layers to counteract the bending force of substrate 30 and the relaxation of polymer layer 182. In the example of FIG. 13, traces 174 are located on top of a polymer layer such as planarization layer 196 (e.g., a layer of polyimide or other polymer). Additional metal layer 102 may be separated from metal layer 192 by a dielectric layer such as layer 104 (e.g., a planarization layer formed from polymer or other suitable material). Metal layer 102 may, if desired, be an extension of a different metal layer in thin-film transistor circuitry 44. For example, layer 192 may be an extension of a lower signal trace layer and layer 102 may be an extension of an upper signal trace layer, or layer 192 may be an extension of a signal trace layer and layer 192 may be an extension of an anode layer, a cathode layer, or a touch layer. As with metal layer 192, metal layer 102 need not carry any electrical signals. One or both of metal layers 192 and 102 may be grounded, or both metal layers 192 and 102 may not be grounded and left floating. One or both of metal layers 192 and 102 may be patterned with gaps, or both metal layers 192 and 102 may not be patterned. If desired, layers 194 may include three or more metal layers. Additional metal layers in layers 194 may be grounded or left floating, and may be patterned with gaps or not patterned. The examples of FIGS. 12A, 12B, and 13 are merely illustrative.

Figure 14:
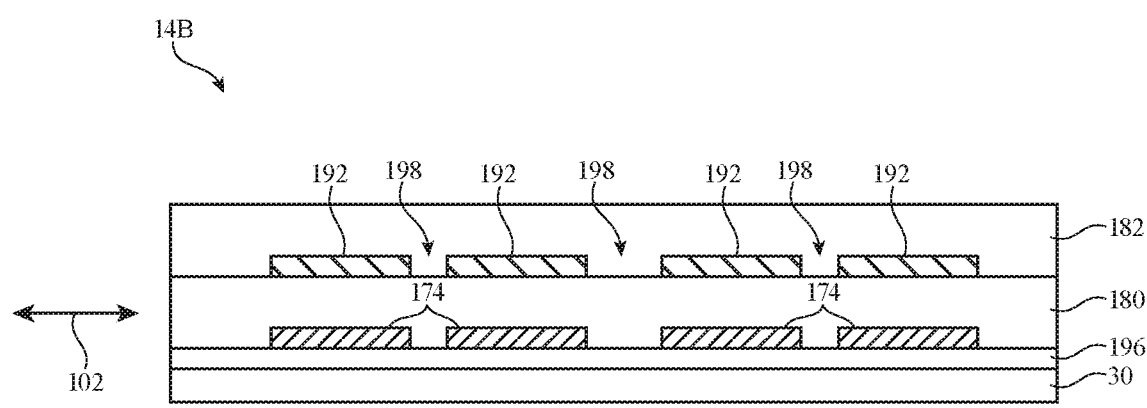
FIG. 14 is a cross-sectional side view of a portion of display showing how a metal layer may include openings that run perpendicular to a bend axis in accordance with an embodiment.

Layer 192 may be a blanket layer without openings or may include one or more openings or slits to facilitate bending in region 14B. FIG. 14 shows an example in which metal layer 192 includes gaps such as gaps 198. Gaps 198 may extend perpendicular to axis 102 (and bend axis 72 of FIG. 5). If desired, metal layer 192 may be patterned to form parallel line segments. The line segments may have meandering shapes (e.g., a zigzag shape of the type shown in FIG. 6, a chain shape, or other suitable shape) or may be straight. The presence of gaps 198 may facilitate bending in region 14B. To ensure that signal paths 174 remain in the neutral plane, the segments of metal layer 192 may overlap signal lines 174. Segments of metal layer 192 may have the same size and shape as signal lines 174, may have a slightly larger footprint than signal lines 174, or may have a smaller footprint than signal lines 174. If desired, the segments of metal layer 192 may be coupled a ground power supply to provide shielding or may be left floating without being actively driven at any power supply voltage.

Figure 15:
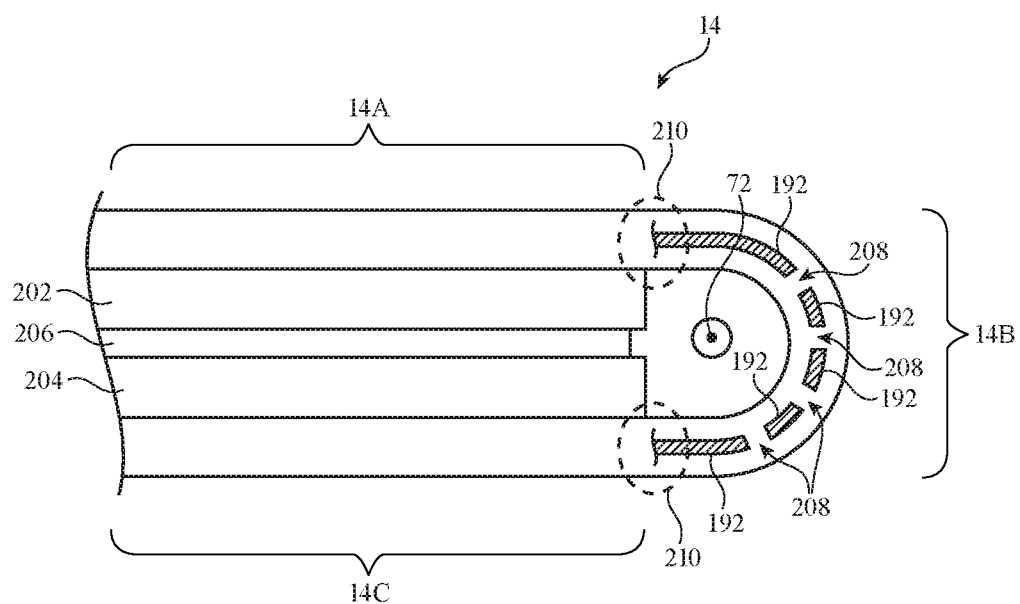
FIG. 15 is a cross-sectional side view of a portion of display showing how a metal layer may include openings that run parallel to a bend axis in accordance with an embodiment.

FIG. 15 shows an example in which layer 194 includes openings 208 that extend parallel to bend axis 72. Openings 208 may be selectively placed to make region 14B more flexible in a desired region. Portion 14C may be bent under portion 14A and may be secured to the underside of portion 14A using layers such as layers 202 and 204. Layer 202 and 204 may be polymer layers (sometimes referred to as backfilms) that are attached to one another using adhesive 206 (e.g., a pressure-sensitive adhesive or other suitable adhesive). The placement of layer 204 relative to layer 202 may be used to control the bend profile of portion 14B.

If care is not taken, kinks in display 14 may occur in regions 210 where display 14 attaches at the edges of layers 202 and 204, which in turn can lead to damage such as cracks. Kinks can be avoided by increasing flexibility in the portion of display 14 that is furthest from the edges of layers 202 and 204. Metal layer 192 may be patterned to include one or more openings 208 in bend region 14B, away from layers 202 and 204 so that kinks do not occur in regions 210. Openings 208 may be continuous elongated slits or may be segmented smaller openings in metal layer 192.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
  a flexible substrate;
  an array of pixels that form an active area on the flexible substrate; and
  zigzag metal traces that extend from the active area to an inactive area on the flexible substrate across a bent region of the flexible substrate, wherein the zigzag metal traces include first and second parallel segments, a third segment that shorts the first segment to the second segment, and a fourth segment that shorts the first segment to the second segment, and wherein the third and fourth segments are perpendicular to the first and second segments such that the first, second, third, and fourth segments surround a rectangular opening.

2. The display defined in claim 1 wherein the rectangular opening is part of an array of rectangular openings in the zigzag metal traces.

3. The display defined in claim 2 wherein the rectangular openings are different sizes.

4. The display defined in claim 3 wherein the zigzag metal traces have corners and wherein the rectangular openings include first and second rectangular openings on opposing sides of one of the corners and a third rectangular opening between the first and second rectangular openings, wherein the third rectangular opening is smaller than the first and second rectangular openings.

5. The display defined in claim 1 wherein the zigzag metal traces have corners and wherein the third segment that shorts the first segment to the second segment is offset from the corners.

6. The display defined in claim 1 wherein the active area overlaps the inactive area of the substrate.

7. A display, comprising:
a flexible substrate;
an array of pixels that form an active area on the flexible substrate;
conductive traces that extend from the active area to an inactive area on the flexible substrate across a bent region of the flexible substrate; and
neutral plane adjustment layers that overlap the conductive traces and that align a neutral plane with the conductive traces, wherein the neutral plane adjustment layers include a metal layer.

8. The display defined in claim 7 wherein the metal layer does not carry a signal.

9. The display defined in claim 7 wherein the neutral plane adjustment layers comprise a polymer coating that overlaps the metal layer.

10. The display defined in claim 7 wherein the metal layer is formed from the same material as an active display layer in the active area.

11. The display defined in claim 10 wherein the active display layer is selected from the group consisting of: a signal layer, an anode layer, a cathode layer, and a touch sensor layer.

12. The display defined in claim 7 wherein the neutral plane adjustment layers comprise an additional metal layer.

13. The display defined in claim 12 wherein the additional metal layer is formed from the same material as an active display layer in the active area and wherein the active display layer comprises an active display layer selected from the group consisting of: a signal layer, an anode layer, a cathode layer, and a touch sensor layer.

14. The display defined in claim 7 wherein the metal layer has openings.

15. The display defined in claim 14 wherein the bent region of the flexible substrate bends around a bend axis, and wherein the openings extend perpendicular to the bend axis.

16. The display defined in claim 14 wherein the bent region of the flexible substrate bends around a bend axis, and wherein the openings extend parallel to the bend axis.

17. A display, comprising:
a flexible substrate having first and second flat portions and a bent portion coupled between the first and second flat portions;
an array of pixels on the first flat portion of the flexible substrate;
touch sensor circuitry on the first flat portion of the flexible substrate;
a metal trace on the flexible substrate that extends from the first flat portion to the second flat portion across the bent portion; and
a polymer layer and a metal layer that overlap the metal trace on the bent portion of the substrate, wherein the metal layer forms an electromagnetic interference shield between the array of pixels and the touch sensor circuitry.

18. The display defined in claim 17 wherein the metal layer is connected to a ground power supply voltage.

19. The display defined in claim 17 wherein the polymer layer and the metal layer align a neutral plane with the metal trace.

20. The display defined in claim 17 wherein the metal trace has sides that are oriented at an angle with respect to an upper surface of the flexible substrate and wherein the angle is between 90 degrees and 180 degrees.

21. The display defined in claim 17 wherein the metal trace comprises a metal layer interposed between a buffer layer and a passivation layer, wherein the buffer layer and the passivation layer have edges that are oriented at an angle with respect to an upper surface of the flexible substrate, and wherein the angle is between 90 degrees and 180 degrees.

* * * * *